United States Patent
Rüth et al.

(10) Patent No.: US 8,961,094 B2
(45) Date of Patent: Feb. 24, 2015

(54) METHOD AND DEVICE FOR ALIGNING SUBSTRATES

(75) Inventors: Edgar Rüth, Kahl am Main (DE); Wolfgang Becker, Schaafheim (DE); Marjan Filipovic, Nidda (DE); Reiner Rohrmann, Freigericht (DE)

(73) Assignee: Singulus Technologies AG, Kahl am Main (DE)

( * ) Notice: Subject to any disclaimer, the term of this patent is extended or adjusted under 35 U.S.C. 154(b) by 0 days.

(21) Appl. No.: 12/998,829

(22) PCT Filed: Apr. 6, 2010

(86) PCT No.: PCT/EP2010/054501
§ 371 (c)(1),
(2), (4) Date: Jun. 7, 2011

(87) PCT Pub. No.: WO2010/112613
PCT Pub. Date: Oct. 7, 2010

(65) Prior Publication Data
US 2012/0009051 A1    Jan. 12, 2012

(30) Foreign Application Priority Data
Apr. 3, 2009    (DE) .......................... 10 2009 016 288

(51) Int. Cl.
*B65H 1/00*    (2006.01)
*H01L 21/68*    (2006.01)
*B65G 47/22*    (2006.01)

(52) U.S. Cl.
CPC .............. *B65G 47/22* (2013.01); *H01L 21/681* (2013.01); *B65G 2203/041* (2013.01); *Y10S 901/46* (2013.01); *Y10S 901/47* (2013.01)
USPC ........ 414/222.04; 414/754; 414/783; 901/46; 901/47

(58) Field of Classification Search
CPC ........ G05D 3/12; G01B 11/022; G01B 11/03; G01B 11/04; H01L 2221/68304; B65G 47/22; B65G 47/24; B65G 47/2445; B65G 2203/041; G06T 2207/30141; G06T 2207/30148
USPC .......... 414/222.04, 936, 754, 783; 901/46, 47
See application file for complete search history.

(56) References Cited

U.S. PATENT DOCUMENTS

| | | | | |
|---|---|---|---|---|
| 4,944,645 A | * | 7/1990 | Suzuki | 414/217 |
| 5,374,147 A | * | 12/1994 | Hiroki et al. | 414/217 |

(Continued)

OTHER PUBLICATIONS

International Search Report for PCT/EP/2010/054501.

*Primary Examiner* — Saul Rodriguez
*Assistant Examiner* — Lynn Schwenning
(74) *Attorney, Agent, or Firm* — Ohlandt, Greeley, Ruggiero & Perle, L.L.P.

(57) ABSTRACT

The invention relates to a method and a device for aligning substrates (2) in an XY-plane. A polygonal, flat substrate (2), the substrate plane of which is parallel to the XY-plane or lies in the XY-plane, is aligned with respect to reference coordinates and a reference angular position in the XY-plane. A corner (12) of the substrate (2) is detected using image detecting means (9). In addition, the position coordinates of the substrate (2) are determined. Using evaluating means (10), the angular position of the corner (12) of the substrate (2) in the XY-plane is determined, and the position differences between the reference coordinates and the position coordinates as well as the angle difference between the reference angular position and the angular position of the substrate corner (12) are calculated. The substrate (2) is moved and/or rotated in the XY-plane according to the determined position difference or the angle difference. By rotating the substrate (2) several times, each corner (12) and edge (13, 14) of the substrate (2) can be detected using the image detecting means (9). This enables an edge inspection during the substrate transport so that additional process steps such as laying the substrate (2) down and picking the substrate back up can be omitted.

16 Claims, 3 Drawing Sheets

(56) References Cited

U.S. PATENT DOCUMENTS

| | | | |
|---|---|---|---|
| 5,740,059 A * | 4/1998 | Hirata et al. | 700/213 |
| 5,908,282 A * | 6/1999 | Onodera | 414/783 |
| 6,195,619 B1 * | 2/2001 | Ren | 702/155 |
| 6,215,897 B1 * | 4/2001 | Beer et al. | 382/151 |
| 6,366,310 B1 | 4/2002 | Nagai et al. | 348/87 |
| 6,549,825 B2 * | 4/2003 | Kurata | 700/245 |
| 6,608,320 B1 | 8/2003 | Shunes et al. | 250/559.19 |
| 6,610,991 B1 | 8/2003 | Case | 250/559.19 |
| 6,688,375 B1 * | 2/2004 | Turner et al. | 165/48.1 |
| 6,847,730 B1 | 1/2005 | Beer et al. | 382/145 |
| 7,137,309 B2 * | 11/2006 | Weiss et al. | 73/865.8 |
| 7,314,344 B2 * | 1/2008 | Chen et al. | 414/763 |
| 7,881,819 B2 * | 2/2011 | Tasaka et al. | 700/214 |
| 8,153,513 B2 * | 4/2012 | Henley | 438/528 |
| 2007/0071581 A1 * | 3/2007 | Gilchrist et al. | 414/217 |
| 2007/0290150 A1 * | 12/2007 | Krupyshev et al. | 250/559.33 |
| 2009/0061627 A1 * | 3/2009 | Trassl et al. | 438/674 |

\* cited by examiner

METHOD AND DEVICE FOR ALIGNING SUBSTRATES

This application is the US National Phase Patent Application of PCT Application No. PCT/EP2010/054501 filed Apr. 6, 2010, claiming priority from German Patent Application No. 10 2009 016 288.7 filed Apr. 3, 2009.

FIELD OF THE INVENTION

The present invention relates to a method and a device for aligning and transporting substrates, in particular a method and a device in which a substrate, which is aligned in any parallel manner with respect to the XY-plane, is aligned in the XY-plane by reference coordinates and a reference angular position, wherein additionally an edge inspection can be carried out during transport.

BACKGROUND TO THE INVENTION

Picking up substrates from upstream machines and/or facilities and laying down the substrates on the downstream machines or facilities is a standard object to be achieved in production engineering. In this regard it is very important to place the substrates onto the downstream machines in a precisely positioned and accurately aligned manner. To this end, the substrates have to be aligned. Alignment of a square substrate can be achieved in that one of the side surfaces of the substrate adjoins a substrate pick-up in a flush manner. This means that the substrate pick-up must contact at least one edge of the substrate. In case of non-square or polygonal substrates, the contact between the substrate pick-up and one side of the substrate does not lead to an exact alignment. It must be inspected which side of the substrate is in contact with the substrate pick-up. If a quality control of the substrates, i.e. an edge inspection, should additionally be carried out, the substrate must be laid down in a further process step so that all edges are freely accessible for an inspection.

For the procedure being as effective as possible, such additional process steps are undesired. It is a further disadvantage of the prior art that the sensitive edges are contacted by the substrate pick-up. Thus, the edges of the fragile substrate can easily be damaged.

In view of the above-mentioned problems of the prior art, it is an object of the present invention to provide a method and a device for aligning substrates, wherein the substrates are not held or contacted by the substrate pick-up on the side but are nevertheless laid down in a precisely positioned and accurately aligned manner. It should be possible to control the quality already during transport, so that no additional process steps are necessary. These and further objects are achieved by the features of the claims.

SUMMARY OF THE INVENTION

In achieving these objects, the invention starts out from the following basic idea: A polygonal, flat substrate lying parallel with respect to an XY-plane is moved and/or rotated in the XY-plane relative to the difference between the position coordinates and the reference coordinates and the difference between the angular position and the reference angular position of the corner of the substrate. By rotating the substrate several times about an axis extending perpendicular with respect to the substrate plane, further or all substrate edges and substrate corners can additionally be inspected while the substrate is being transported.

A substrate pick-up (e.g. a suction device) can hold (suck) a polygonal, flat (preferably square) substrate in the center. The substrate pick-up is preferably movable in the XYZ-direction and additionally rotatable about the Z-axis, i.e. perpendicular with respect to the substrate plane or XY-plane. An image detecting means detects a corner of the substrate. Then, the position coordinates and the angular position of the corner of the substrate are determined. By means of evaluating means, the position differences between the reference coordinates and the position coordinates as well as the angle difference between the reference angular position and the angular position of the substrate corner can be determined. When knowing the position difference and the angle difference, the substrate pick-up can be moved and/or rotated accordingly, so that the substrate can be laid down in a precisely positioned and accurately aligned manner. Damage to the substrate edges can be avoided because the substrate edges are not contacted. The substrate can be rotated several times about an axis extending perpendicular with respect to the substrate surface. Thus, all corners and edges of the substrate are detected by means of the image detecting means. By means of the evaluating means, an inspection of the corners and edges can be carried out on the basis of the obtained data. An additional process step (such as, e.g., laying down or picking back up the substrate) is not necessary. By means of this edge inspection, unusable or damaged substrates can be sorted out.

Before picking up or after laying down the substrate by means of the substrate pick-up, a cost-efficient reception control can additionally be carried out. To this end, the substrates are illuminated from the bottom by means of an illuminating device. A line scanning camera can detect hairline cracks and defective areas on the substrate based on the shining through light.

The invention is suitable in particular also for the photovoltaic field, i.e. for treating and handling so-called PV substrates (PV=photovoltaic).

BRIEF DESCRIPTION OF THE DRAWINGS

In the following, the invention is described in more detail with reference to the drawings in which FIG. 2b shows a sectional view along the dashed line of FIG. 2a.

DETAILED DESCRIPTION OF THE INVENTION

Figure 1:
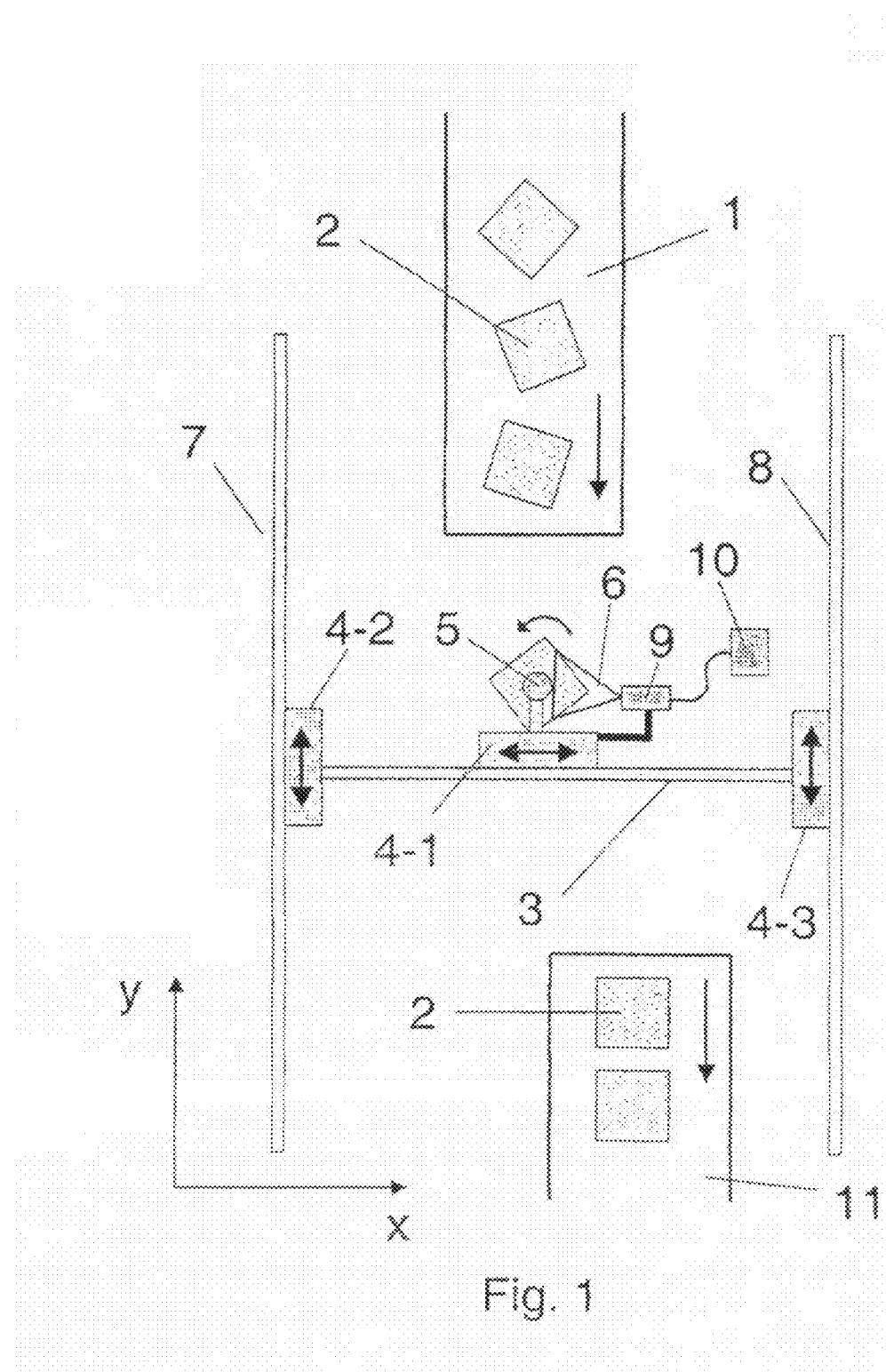
FIG. 1 shows a schematic view of a substrate pick-up according to the invention, which is movable in the XYZ-direction and additionally rotatable about the Z-axis.

FIG. 1 shows a device according to the invention for transporting a substrate 2 and positioning it in an accurately aligned manner. From an upstream machine or facility, which is not shown, the substrate 2 is laid down on a conveying belt 1. The conveying belt moves in the direction of the arrow in FIG. 1. Subsequently, the substrate 2 is laid down on a further conveying belt 11 in an accurately aligned and precisely positioned manner. This conveying belt 11 transports the substrate 2 in the direction of the arrow to a downstream machine or facility (which is not shown either). The first conveying belt 1 defines an XY-plane. The substrate 2 rests in an arbitrarily aligned manner in the XY-plane on the conveying belt 1 moving in the direction of the arrow. In the following, each plane being parallel with respect to this plane is also referred to as XY-plane. The polygonal, flat substrate 2 can be square, as shown in FIG. 1. It can be a substrate made of silicon and having, e.g., a side length of 156 mm and a thickness of 150 μm.

The substrate 2 is picked up from the conveying belt 1 by means of a substrate pick-up 5 which can, e.g., be moved upwards and downwards (see the double arrow P in FIG. 2b), wherein the sensitive substrate edges are not contacted. The substrate 2 is preferably picked up in the center. The substrate pick-up 5 can be configured as a suction device. The substrate pick-up is connected with a slide 4-1 which is movable on a rail 3 in the XY-plane in the X-direction. The rail 3 is moved via two further slides 4-2 and 4-3 along the rail 7 and the rail 8, respectively, in the Y-direction. Thus, the substrate pick-up 5 can be moved by means of the movable slides 4-1, 4-2 and 4-3 in the X- and Y-directions by using servo motors (not shown). Additionally, by using a further servo motor, the substrate pick-up 5 can be moved in the Z-direction, i.e. perpendicular with respect to the drawing plane (the possibility of moving the substrate pick-up in the Z-direction is not shown either in FIG. 1). The servo motors can be attached directly to the slides 4-1, 4-2 and 4-3. However, it is also possible to install the servo motors in a stationary manner and to select a suitable power transmission (e.g. via a chain or toothed belt drive) from the servo motors to the slides. By means of a further servo motor, which is not shown, the substrate pick-up 5 is rotated about its center axis. Thus, the substrate pick-up 5 can make a rotary movement in the XYZ-direction in the XY-plane with the picked-up substrate 2 while the substrate is being transported.

Figure 2A:
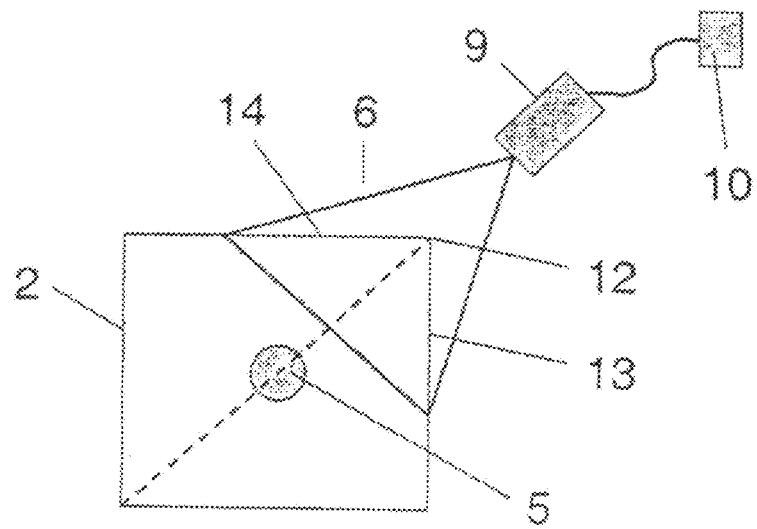
FIG. 2a shows a schematic top view of the image detecting area of an image detecting means of a substrate.
Figure 2B:
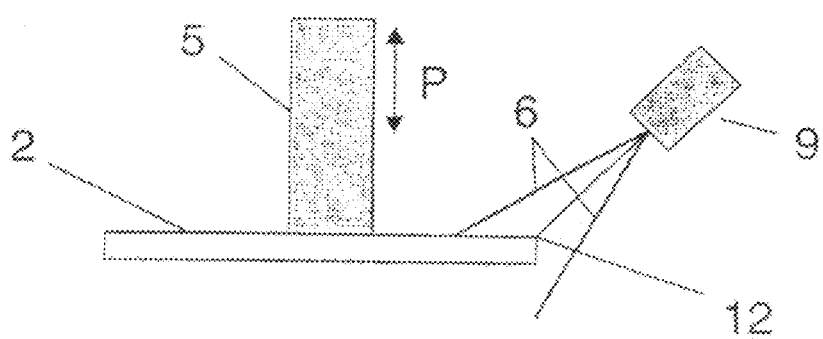

FIGS. 2a and 2b show the substrate 2 being picked-up by the substrate pick-up 5. FIG. 2a shows a top view of the substrate 2 being held by the substrate pick-up 5. The image detecting area 6 of an image detecting means 9 is determined by the distance between the substrate 2 and the image detecting means 9 and the angle at which the image detecting means 9 records. FIG. 2b shows a section through the substrate 2 and the substrate pick-up 5 along the dashed line in FIG. 2a. According to FIG. 2b, the image detecting means 9 detects a corner 12 and the two adjacent edges 13, 14 of the substrate 2 in an angle from above. The image detecting means 9 can be connected with the slide 4-1, as schematically shown in FIG. 1 (in FIGS. 2a and 2b the slide 4-1 is not shown). The image detecting means can comprise a camera 9 attached to the slide 4-1 and a data processing means 10. As shown in FIG. 1, the data processing means 10 can be connected with the camera 9 via a cable or via a radio contact. Alternatively, the data processing means 10 can also be integrated in the camera 9. The camera 9 detects the corner 12 of the substrate 2 which is located in the image detecting area 6 of the camera 9. The data of the image detecting means 9 are transmitted to evaluating means 10. By means of the evaluating means 10, the angular position of this corner 12 and of the two adjacent edges 13, 14 of the substrate in the XY-plane is detected. Then, the angle difference between the reference angular position (i.e. the desired orientation of the substrate 2 in the XY-plane at the laying-down point) and the angular position of the substrate corner 12 is calculated. Additionally, the position coordinates of the substrate 2 are detected by means of a position coordinate detecting means. The evaluating means 10 also calculates the position differences between the reference coordinates (desired position of the substrate when laying it down) and the position coordinates. On the basis of the position difference and the angle difference and by means of the XYZ positioning and the rotation of the substrate pick-up 5, the substrate 2 can be transported in a precisely positioned manner to the laying-down point and aligned accurately. Here, the substrate 2 is rotationally aligned while being transported.

In the method described above, the substrate 2 is picked up by means of the substrate pick-up 5, wherein none of the edges of the substrate 2 is contacted. It is the great advantage that the fragile edges thus cannot be damaged.

According to the invention, the necessary image processing periods as well as the movement reaction periods can be kept short. The period starting from picking-up the substrate 2 until laying down the precisely positioned substrate 2 can be in the range of 350 to 500 ms in case the laying-down point is about 1 m away.

While transporting the substrate and/or while aligning the substrate, simultaneously an edge inspection can be carried out in accordance with the invention. As described above, the substrate 2 is picked-up by means of the substrate pick-up 5, and the corner 12 and large portions of the two adjoining edges 13, 14 of the substrate 2, which are located in the image detecting area 6 of the camera 9, are detected. After the first image detection of the image detecting means 9, the polygonal, flat substrate 2 is rotated in the XY-plane about an axis extending perpendicular with respect to the substrate plane (XY-plane) until the next corner is located in the image detecting area 6. Then, this corner 12 and large portions of the two adjoining edges 13, 14 are detected. It must be guaranteed that the edge between the two detected corners 12 is also detected completely. To this end, the image detecting area 6 for detecting the first corner 12 must overlap the image detecting area 6 for detecting the subsequent corner 12. Rotating the substrate 2 and detecting the corner 12 and the adjoining edges 13, 14 is repeated until all corners and edges of the substrate have been detected. In case of a square substrate 2, a complete image of the substrate edge is received after three rotations by 90° about the axis extending perpendicular with respect to the substrate plane. The recorded data are transmitted to the evaluating means 10. On the basis of the result of the evaluation, defects in the substrate edge can be detected and shown. These substrates 2 can be sorted out, e.g., as defective substrates 2. Subsequent to the quality control, the substrates are aligned and laid down. In this connection it is advantageous that a quality control of the substrates 2 takes place already during transport. In this cost-efficient and time-saving quality control it is guaranteed that the sensitive edges of the substrates 2 are not contacted and thus not damaged either. An additional movement towards a separate test station is not necessary.

Figure 3:
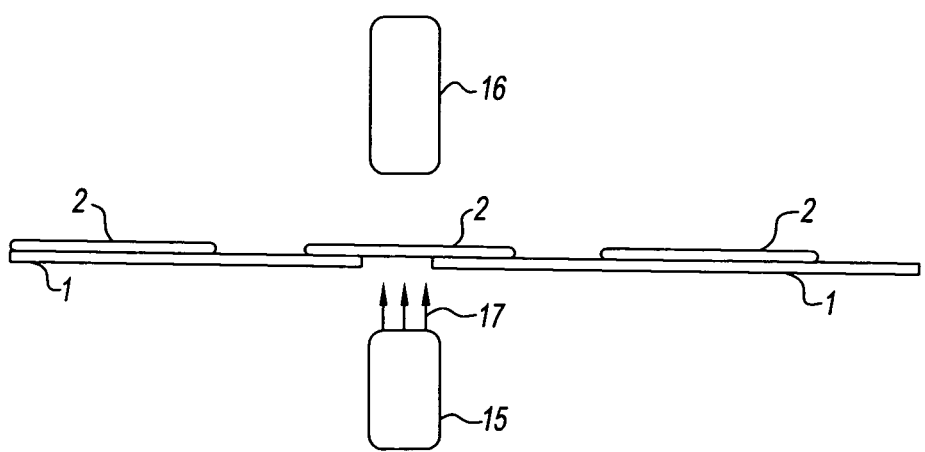
FIG. 3 is a side view of the means for detecting damage to substrates 2.

In addition to the inspection of the substrate edges 13, 14 described above, a cost-efficient reception control of all substrates 2 can be carried out. As shown in FIG. 3 reception control of all substrates can take place, e.g., at a position between two conveying belts 1, i.e., between two transport belts, linear conveyors, rotary tables etc. Illumination 15 from the bottom shines through the two conveying belts onto the substrates 2. By means of a line scanning camera 16, the shining through light 17 is detected above the conveying belt. Thus, hairline cracks and defective areas on the substrate 2 can be detected. Substrates thus can be inspected in a cost-efficient manner with respect to previous damage and sorted out, if necessary.

The invention claimed is:
1. A method for aligning a polygonal, flat substrate (2) in an XY-plane, the plane of the substrate being parallel to the XY-plane or lying therein, with respect to reference coordinates and a reference angular position in the XY-plane, the method comprising:

while the substrate is being transported:
- (a) detecting information of an image of a corner of the substrate,
- (b) evaluating the detected image information with respect to defects of the substrate corner and edges of the substrate adjoining the corner,
- (c) rotating the substrate about an axis extending perpendicular with respect to the substrate plane until the next corner is detected,
- (d) repeating steps (a) to (c) until all substrate corners are detected,
- (e) determining position coordinates and angular positions of the substrate corners of the substrate in the XY-plane,
- (f) calculating position differences between the reference coordinates and the position coordinates as well as an angle difference between the reference angular position and the angular position of at least one of the substrate corners, and
- (g) moving and/or rotating the substrate in the XY-plane in accordance with at least one of the position differences or the angle difference.

2. The method according to claim 1, wherein a substrate comprising a defect at a substrate edge or substrate corner is sorted out.

3. The method according to claim 1, wherein the substrate is picked-up without contacting edges of the substrate for moving, rotating and/or transporting.

4. The method according to claim 1, wherein the substrate is rectangular.

5. The method according to claim 4, wherein the substrate has a side length of 100 to 160 mm, or a thickness of 50 to 250 µm.

6. The method according to claim 1, wherein the substrate comprises silicon.

7. The method according to claim 1, comprising a reception control of the substrate before or after aligning the substrate in order to detect possible previous damage.

8. A device for aligning a polygonal, flat substrate in an XY-plane, the plane of the substrate being parallel to the XY-plane or lying therein, with respect to reference coordinates and a reference angular position in the XY-plane, in particular for carrying out the method according to claim 1, comprising:
- (a) image detecting means for detecting a corner of the substrate,
- (b) means for detecting position coordinates of the substrate,
- (c) evaluating means for detecting an angular position of the corner of the substrate in the XY-plane and for calculating position differences between the reference coordinates and the position coordinates as well as an angle difference between the reference angular position and the angular position of the substrate corner, and for evaluating the information of the image detecting means with respect to defects of the substrate corner and edges of the adjoining the corner of the substrate,
- (d) means for rotating the substrate towards another corner about an axis extending perpendicular with respect to the plane of the substrate, and
- (e) means for moving and/or rotating the substrate in the XY-plane in accordance with the position differences or the angle difference.

9. The device according to claim 8, comprising means for sorting out a substrate comprising a defect at a substrate edge or substrate corner.

10. The device according to claim 8, comprising a substrate pick-up which picks up the substrate without contacting the substrate edges.

11. The device according to claim 8, wherein the substrate is rectangular.

12. The device according to claim 8, comprising means for carrying out an additional control in which the substrate is inspected in view of previous damage.

13. The method according to claim 1, wherein the substrate is a substrate for producing photovoltaic substrates.

14. The device according to claim 8 that is a device for processing or producing substrates that are for producing photovoltaic substrates.

15. The method according to claim 4, wherein the substrate is square.

16. The device according to claim 5, wherein the substrate has a side length of about 156 nm and/or a thickness of about 150 µm.

* * * * *